United States Patent
Itkin et al.

(10) Patent No.: US 6,828,863 B2
(45) Date of Patent: Dec. 7, 2004

(54) MULTI-BAND FREQUENCY SYNTHESIZER FOR MOBILE TERMINALS

(75) Inventors: Grigory Itkin, München (DE); Alexander Pestryakov, Chimki (RU)

(73) Assignee: Sony International (Europe) GmbH, Berlin (DE)

( * ) Notice: Subject to any disclaimer, the term of this patent is extended or adjusted under 35 U.S.C. 154(b) by 23 days.

(21) Appl. No.: 10/315,864

(22) Filed: Dec. 10, 2002

(65) Prior Publication Data

US 2003/0155949 A1 Aug. 21, 2003

(30) Foreign Application Priority Data

Dec. 12, 2001 (EP) .............................. 01129616

(51) Int. Cl.[7] .............................................. H03L 7/00
(52) U.S. Cl. .............................. 331/2; 331/179; 331/46; 327/105; 455/260
(58) Field of Search .............................. 331/2, 46, 179; 327/105; 455/260

(56) References Cited

U.S. PATENT DOCUMENTS

| | | | | |
|---|---|---|---|---|
| 5,373,256 A | * | 12/1994 | Nicotra et al. ................. | 331/2 |
| 5,408,201 A | | 4/1995 | Uriya ........................... | 331/2 |
| 6,441,690 B1 | * | 8/2002 | Savelli et al. ................. | 331/1 A |

FOREIGN PATENT DOCUMENTS

| EP | 0 964 523 | 12/1999 |
|---|---|---|
| EP | 1 148 654 | 10/2001 |
| EP | 1 170 874 | 1/2002 |

OTHER PUBLICATIONS

EP 01 12 9616 Search Report Oct. 30, 2002.

* cited by examiner

Primary Examiner—Arnold Kinkead
(74) Attorney, Agent, or Firm—Frommer Lawrence & Haug LLP; William S. Frommer; Bruno Polito

(57) ABSTRACT

A frequency synthesizer arrangement for generating signals with frequencies for UMTS and GSM/GPRS frequency bands and a mobile terminal with a respective frequency synthesizer arrangement are proposed, comprising a reference frequency source for providing a signal of constant reference frequency, a first frequency synthesizer sub-unit for transforming the signal of the reference frequency source into a signal with a frequency in a range of a first type of frequency band, a second frequency synthesizer sub-unit for transforming the signal of the reference frequency source into a signal with a frequency in a range of a second type of frequency band, whereby the second frequency synthesizer sub-unit further transforms the signal of the reference frequency source into a signal with an intermediate frequency, and a third frequency synthesizer sub-unit transforms the signal of the reference frequency source into an auxiliary signal with a fixed frequency which is used together with the signal of intermediate frequency for generating signals with frequencies in a range of a third and of a fourth type of frequency band.

8 Claims, 4 Drawing Sheets

MULTI-BAND FREQUENCY SYNTHESIZER FOR MOBILE TERMINALS

BACKGROUND OF THE INVENTION

1. Field of the Invention

The present invention refers to frequency synthesisers, in particular to multi-band frequency synthesisers used in mobile terminals for wireless telecommunication networks.

2. Description of the Related Art

New generation mobile terminal are equipped to support data transmission on UMTS (Universal Mobile Telecommunications System) and GSM/GPRS (Global System for Mobile Communication/General Packet Radio Services) frequency bands in one body. Therefore multi-band frequency synthesiser are required which support UMTS-FDD (UMTS-Frequency Division Duplex) and UMTS-TDD (UMTS-Time Division Duplex) frequency bands as well as triple bands functionality (GSM900/DCS1800/PCS1900 MHz) for GSM/GPRS in both up- ($T_x$) and down-link ($R_x$) directions. DCS hereby stands for Digital Cellular System and PCS for Personal Communications Service.

Today's known implementations of multi-band frequency synthesisers are based on the usage of independent frequency synthesisers, one for UMTS—up-link, one for UMTS—down-link and a third one for triple band GSM/GPRS. To achieve the necessary class 12 settling time for GPRS (below 150 $\mu$s) Fractional-N synthesisers are commonly used.

The biggest advantage of Fractional-N frequency synthesisers is their fast settling time when e.g. switching from an up-link to a down-link frequency band or at an intersystem handover, which fulfils one of the preconditions for a reliable GPRS data transmission. The biggest disadvantage of all classes of Fractional-N frequency synthesisers is their bad output spectrum performance which is characterised by high phase noise and a high amount of spurious spectra. Especially when receiving low-level signals, this can be very problematic. When using Fractional-N frequency synthesisers, the requirements of GSM standard 0505 can only be achieved by post-processing the output spectra with high-quality filters, which are bulky and cost-intensive. This collides with the general requirements for a compact design of mobile terminals not leaving much space for bulky components, and for cost-effective technical solutions.

SUMMARY OF THE INVENTION

It is therefore an object of the present invention to propose a cost-effective multi-band frequency synthesiser with minimal space requirements but with a short settling time and with very low phase noise and a very low portion of spurious spectra.

This object is achieved by a frequency synthesiser arrangement and a mobile terminal as claimed in the respective independent claims.

In particular, the above object is achieved by a frequency synthesiser arrangement for generating signals with frequencies for UMTS and GSM/GPRS frequency bands, comprising a reference frequency source for providing a signal of constant reference frequency, a first frequency synthesiser sub-unit for transforming the signal of the reference frequency source into a signal with a frequency in a range of a first type of frequency band, a second frequency synthesiser sub-unit for transforming the signal of the reference frequency source into a signal with a frequency in a range of a second type of frequency band, whereby the second frequency synthesiser sub-unit further transforms the signal of the reference frequency source into a signal with an intermediate frequency, and a third frequency synthesiser sub-unit transforms the signal of the reference frequency source into an auxiliary signal with a fixed frequency, i.e. small frequency range, which is used together with the signal of intermediate frequency for generating signals with frequencies in a range of a third and of a fourth type of frequency band.

The first, second, third and fourth type of frequency bands are different from each other and correspond to the frequency bands necessary for different wireless communication standards. In particular, the first type of frequency band supports the UMTS TDD1, FDD-$T_x$ and TDD2 standards, the second type of frequency band supports the UMTS FDD-$R_x$ standard, the third type of frequency band supports the GSM/GPRS 1800/1900 MHz standards DCS and PCS, and the fourth type of frequency band supports the GSM 900 MHz standard.

The above object is further achieved by a mobile terminal for use with UMTS and GSM/GPRS frequency bands with a frequency synthesiser arrangement according to the present invention.

The solution of the present invention advantageously provides a multi-band frequency synthesiser for communication on UMTS/GSM/GPRS frequency bands of compact design, fast switching behaviour, with no spurious spectra produced in an unwanted frequency band, and which shows low phase noise. Furthermore, by dispensing complex components in the design, a cost-effective solution is achieved.

Additional advantageous features of the present invention are claimed in the respective sub-claims.

The frequency synthesiser sub-units advantageously comprise a frequency divider for transforming the signal of the reference frequency source into a scaled-down signal which frequency value represents the reference frequency divided by an integer value, and the frequency synthesiser sub-units comprise further advantageously a phase locked loop frequency synthesiser for transforming the scaled-down signal into a signal which frequency is an integer multiple of the scaled-down signal.

A frequency mixer preferably mixes a signal from the second synthesiser sub-unit with a signal derived from the auxiliary signal for forming a signal in a range of the third type of frequency band or for forming a precursor for deriving a signal in a range of the fourth type of frequency band. Advantageously, a frequency divider divides the frequency of the auxiliary signal by an integer value before it is being applied to the frequency mixer.

In a preferred embodiment of the present invention, a frequency divider derives a signal in a range of the fourth type of frequency band from a signal supplied by the frequency mixer by dividing the frequency of the signal supplied by the frequency mixer with an integer value.

A low pass filter is preferably used to eliminate harmonics created in the circuitry for generating signals used for a signal with a frequency in a range of the third or the fourth type of frequency band, and further preferably a low pass filter is used to eliminate harmonics created by the frequency divider providing the signals for the fourth type of frequency band.

The frequencies of the first type of frequency band may advantageously take on values from one of the frequency intervals ranging from 1900 MHz to 1980 MHz and 2010 MHz to 2025 MHz, the frequencies of the second type of frequency band may further advantageously take on values from the frequency interval ranging from 2110 MHz to 2170 MHz, the frequencies of the third type of frequency bands may preferably take on values from one of the frequency bands situated within an interval ranging from 1710 MHz to 1990 MHz, and further preferably, the frequencies of the fourth type of frequency bands may take on values from one of the frequency bands situated within an interval ranging from 880 MHz to 960 MHz.

The present invention may advantageously be implemented on mobile phones particularly for wireless cellular telecommunication networks,

BRIEF DESCRIPTION OF THE DRAWINGS

In the following description, the present invention is explained in more detail with respect to special embodiments and in relation to the enclosed drawings, in which.

DETAILED DESCRIPTION OF THE DRAWINGS

Figure 1:
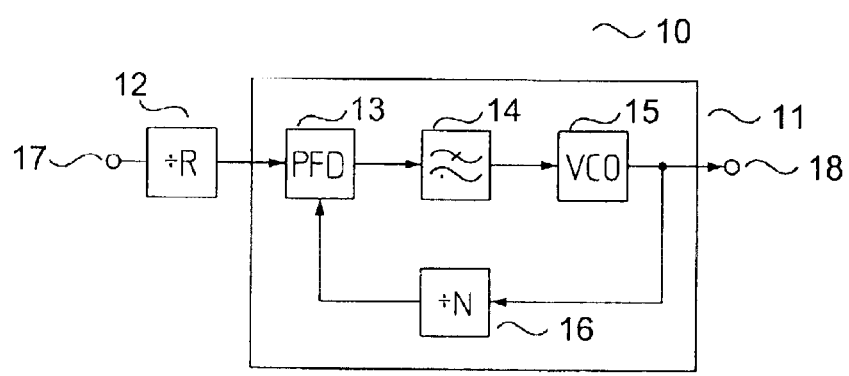
FIG. 1 shows the schematic circuit diagram of a frequency synthesiser sub-unit according to the present invention.

FIG. 1 illustrates the principles of a frequency synthesiser sub-unit 10 used in the multi-band frequency synthesiser according to the present invention. The signals generated at an output 18 of a sub-unit constitute either directly a frequency of a respective frequency band or constitute an auxiliary frequency for further processing.

The inputs 17 of all sub-units are supplied with a reference frequency signal $f_r$ from a reference crystal oscillator. In a first stage, the reference frequency $f_r$ is scaled down to $f_D = f_r/R$ by an integer division coefficient R set at the programmable frequency divider 12 by digital control code. The following phase locked loop frequency synthesiser 11 then adjusts the output frequency of a voltage controlled oscillator (VCO) 15 to the desired value.

The phase locked loop frequency synthesiser 11 works in principle like a frequency multiplier with a frequency raster $f_D$. This is achieved by a using a programmable integer frequency divider 16 in the feedback line of the phase locked loop frequency synthesiser which scales down the output frequency of the VCO 15 by the division coefficient N.

The phase locked loop frequency synthesiser comprises a phase frequency detector 13 which provides an output voltage $u_o(t)$ proportional to the phase angle deviation between the input frequency $f_D$ and the down-scaled output frequency $f_o/N$. This output voltage $u_o(t)$ is filtered by a low pass filter 14 before being supplied to the VCO 15. The filter characteristics of low pass 15 are wide enough to allow a fast switching of the output frequency or quick lock time, respectively, when changing the between frequency bands and narrow enough to block off higher frequencies which otherwise would cause phase noise in the output spectrum of the voltage controlled oscillator. The output frequency $f_o$ of the VCO 15 is a function of the value of the filtered output voltage $u_f(t)$ which is supplied to it. In the feedback loop of the phase locked loop frequency synthesiser 11, this output frequency signal $f_o$ is scaled down with an appropriate integer value N to a value equal that of $f_D$ for being applied to the phase frequency detector 13. There it is compared with the original frequency signal $f_D$ to produce the control voltage $u_o(t)$ for the VCO 15. After termination of the transient processes, the value of the output frequency $f_o$ is thus controlled by the code division coefficient N set at the programmable frequency divider 16 of the feedback loop according to the equation:

$$f_o = N \times f_D = \frac{N}{R} \times f_r;$$

with N and R as integers.

According to equation 1, the output frequency $f_o$ is an integer multiple of the input frequency $f_D$ or, in other words, $f_D$ defines a frequency raster for $f_o$. A change in the output frequency is achieved by changing the division coefficient N, a process sufficiently fast to allow fast frequency hopping. Neither spurious spectra nor additional phase noise that are so characteristic for fractional-N frequency synthesisers are produced by this procedure so that no extra filters for a post-processing of the output spectra of the phase locked loop frequency synthesiser 11 are required.

Figure 2:
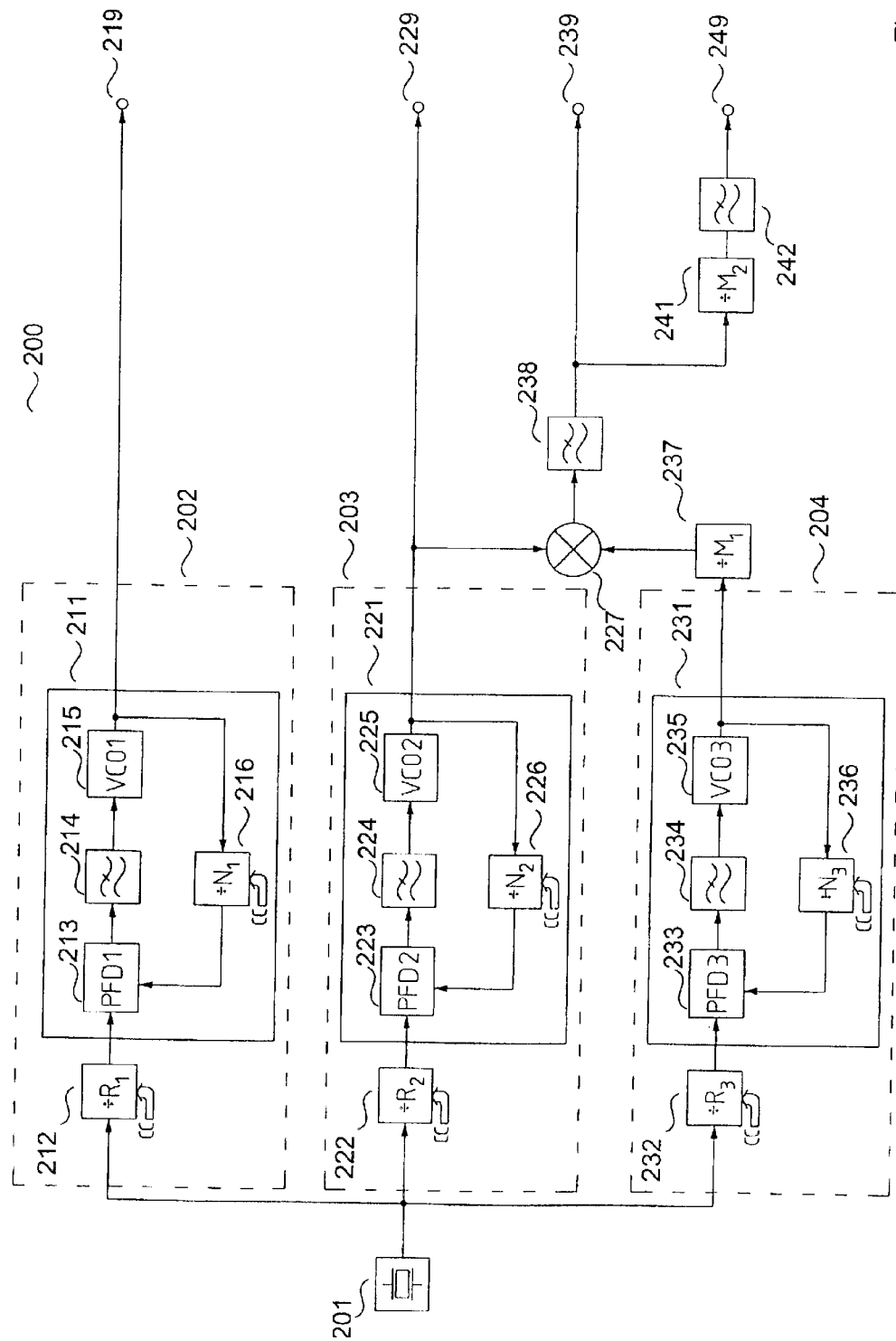
FIG. 2 shows the schematic circuit diagram of a multi-band frequency synthesiser according to the present invention.

A multi-band frequency synthesiser unit 200 according to the present invention is shown in FIG. 2. It comprises the three phase lock loop frequency synthesisers PLL1 211, PLL2 221, and PLL3 231 of the type described with reference to FIG. 1. Two of them, namely PLL1 and PLL2 work for UMTS up- and down-links, while the third (PLL3) produces in combination with PLL2 and additional mixers and frequency dividers all necessary frequencies for triple band GSM/GPRS functionalities. Each phase lock loop frequency synthesiser is preceded by a programmable frequency divider which receives its input frequency signal from a reference frequency source 201 like e.g. a crystal oscillator providing a stabilised oscillation frequency of 19.2 MHz.

Different from the first phase lock loop frequency synthesiser 211, the second phase lock loop frequency synthesiser 221 operates alternately at two different input frequencies supplied from the preceding phase frequency divider 222. The UMTS down-link frequencies are provided with the first input frequency, the intermediate frequency signals forming a basis for the provision of the GSM/GPRS bands are provided with second input frequency. This positively affects the settling time and phase noise for the GSM/GPRS frequency bands.

The third phase lock loop frequency synthesiser 231 is narrow banded (about 24 MHz) and processes a high frequency at the phase frequency detector 233 which reduces the settling time and the phase noise. The divider 237 at its output scales down the output frequency and also the frequency steps of the phase lock loop frequency synthesiser 231 by a factor of $M_1$. This reduces the phase noise even further.

The multi-band frequency synthesiser shown in FIG. 2 has four output terminals 219, 229, and 249, each providing signal for a certain frequency band. The assignment of the frequency bands to the respective output terminals is shown in table 1.

TABLE 1

Frequency range assignments for output terminals of the multi-band frequency synthesiser 200

| Terminal | Frequency Band | Frequency Range/MHz |
|---|---|---|
| 219 | TDD1, FDD-$T_x$ | 1900–1980 |
| 219 | TDD2 | 2010–2025 |
| 229 | FDD-$R_x$ | 2110–2170 |
| 239 | DCS-$T_x$ | 1710–1785 |
| 239 | DCS-$R_x$ | 1805–1880 |
| 239 | PCS-$T_x$ | 1850–1910 |
| 239 | PCS-$R_x$ | 1930–1990 |
| 249 | GSM-$T_x$ | 880–915 |
| 249 | GSM-$R_x$ | 925–960 |

The synthesiser branch 202 of the multi-band frequency synthesiser 200 providing the first output terminal 219 produces signals with frequencies in the UMTS frequency bands 'FDD transmitter' (FDD-$T_x$) and TDD1 (1900–1980 MHz), and TDD2 (2010–2025 MHz), respectively. The programmable frequency divider 212 scales down the reference frequency $f_r$ by a factor $R_1$, whereby the integer $R_1$ is set to the value of 96 as a result of which a frequency signal $f_{D1}$ of 0.2 MHz is produced at its output. The code division coefficient $R_1$ is set, like for all other programmable frequency dividers used in the circuit representation of FIG. 2, by means of a control code CC.

The function of a phase lock loop frequency synthesiser has already been described with reference to FIG. 1. The integer code division coefficient $N_1$ applied to the feedback line of PLL1 succeeding the programmable frequency divider 212 is programmably adjustable for producing the desired frequency of the output signal $f_{o1}$ according to equation 1. For the TDD1/FDD-$T_x$ frequency bands, the values of $N_1$ range from 9500 to 9,900, whereby incrementing $N_1$ by a value of 1 results in an incrementation of $f_{o1}$ by a value of 0.2 MHz. For the TDD2 frequency band, the values of $N_1$ have to be adjusted in the interval beginning with 10,050 and ending at 10,125.

When operating in the UMTS frequency band 'FDD receiver' (FDD-$R_x$) ranging from 2110 to 2170 MHz, the output signal $f_{o2}$ of PLL2 221 is supplied to the second output terminal 229. To this end, the programmable frequency divider 222 of the second synthesiser branch 203 of the multi-band frequency synthesiser 200 scales down the reference frequency $f_r$ by a factor $R_2$ being with a value of 96 equal to $R_1$. The resulting signal is then multiplied in PLL2, whereby the multiplication factor is controlled by the code division coefficient $N_2$ applied to the feedback loop. The values of $N_2$ range from 10,550 to 10,850. The frequency raster of the output frequency $f_{o2}$ or the possible incremental changes of $f_{o2}$, respectively, are hereby fixed to steps of 0.2 MHz.

The second synthesiser branch 203 of the multi-band frequency synthesiser 200 can be operated in a second mode to produce frequencies appropriate for deriving the GSM/GPRS frequency bands. In this second mode, the programmable frequency divider 222 scales down the reference frequency $f_r$ by a factor $R_2$=6, thereby supplying PLL2 with an input frequency signal of $f_{D2}$=3.2 MHz. This frequency is multiplied by PLL2 to frequencies in the range of 2110 to 2390 MHz with a frequency raster of 3.2 MHz. The large frequency steps guarantee a short settling time together with a low phase noise also for the GSM/GPRS frequency signals. The second synthesiser branch 203 of the multi-band frequency synthesiser works in both modes according to the principles described with reference to FIG. 1.

To derive the GPRS frequency bands from the signal provided at the output of PLL2, the signal is mixed in frequency mixer 227 with an auxiliary frequency $f_{o3}/8$ provided from the third synthesiser branch 204 of the multi-band frequency synthesiser 200. The frequency mixer 227 acts in combination with the low pass filter 238 as a subtractor according to the equation:

$$f_{GPRS} = f_{o2} - \frac{f_{o3}}{8};$$

whereby $f_{o3}$ represents the frequency of the output signal from PLL3 231.

For providing the auxiliary frequency signal $f_{o3}$ in the third synthesiser branch 204 of the multi-band frequency synthesiser 200, the reference frequency $f_r$ is scaled down by R3, having a value of 12. The resulting signal with a frequency of 1.6 MHz is then supplied to PLL3 231, where it is transformed to a signal $f_{o3}$ with a frequency around 3200 MHz by setting the division coefficient $N_3$ of the programmable frequency divider 236 to a constant value of 2000. Before being applied to an input of the frequency mixer 227, $f_{o3}$ is scaled down to 400 MHz in the digital frequency divider 237 by a factor $M_1$ of fixed value 8. The GPRS frequency bands are thus provided by adjusting $f_{O2}$ to an appropriate value. A detailed relation between the division coefficient $N_2$, the frequency band of the output signal $f_{o2}$ of PLL2 and the desired GPRS frequency band is given in table 2.

TABLE 2

Relations between parameters of PLL3 and respective GSM bands; frequencies are given in MHz

| $N_2$ | $f_{o2}$ | frequency band | frequency range |
|---|---|---|---|
| 657–683 | 2110–2185 | DCS-$T_x$ | 1710–1785 |
| 689–713 | 2205–2280 | DCS-$R_x$ | 1805–1880 |
| 703–722 | 2250–2310 | PCS-$T_x$ | 1850–1910 |
| 728–747 | 2330–2390 | PCS-$R_x$ | 1930–1990 |

The low pass filter 238 blocks off harmonics originating from the mixing process in the frequency mixer 227 and also harmonics having their source in one of the voltage controlled oscillators 225 (VCO2) or 235 (VCO3). The signal provided at the output of low pass filter 238 to the third output 239 of the multi-band frequency synthesiser 200 is thus given by equation 2 above.

The frequencies for the GSM bands provided at the fourth output terminal 249 of the multi-band frequency synthesiser 200 are derived from the output of low pass filter 238 acting as a precursor by further scaling down the precursor frequency by a factor $M_2$ of fixed value 2, and subsequent filtering in low pass filter 242 to eliminate harmonics produced in the digital frequency divider 241. The frequencies at the output of the low pass filter 238 must be divisible by 2 for a simple construction of the digital frequency divider 242.

A detailed relation between the division coefficient $N_2$, the frequency band of the output signal $f_{o2}$ of PLL2 and the desired GSM frequency band is given in table 3.

TABLE 3

Relations between parameters of PLL2, precursor frequency range, and respective GPRS bands; frequencies are given in MHz

| $N_2$ | $f_{o2}$ | precursor range | frequency band | frequency range |
|---|---|---|---|---|
| 675–697 | 2160–2230 | 1760–1830 | GSM-$T_x$ | 880–915 |
| 703–725 | 2250–2320 | 1850–1920 | GSM-$R_x$ | 925–960 |

There is no need to post-process the output signals $f_{o1}$ and $f_{o2}$ of PLL1 and PLL2, respectively, by low pass filters like for the GSM/GPRS frequency bands, because the coding used for UMTS like e.g. CDMA (Code Division Multiple Access) spreads the information contained in a particular signal of interest over a much greater bandwidth than the original signal, thereby enhancing the interference immunity of the signal transmission. Spurious signals from harmonics of VCO1 or VCO2 will therefore not degrade quality of a signal transmission.

It has to be noted, that the UMTS-up-link frequencies are produced independent of the GSM/GPRS up- and down-link frequencies to guarantee a GSM monitoring during an UMTS call in uncompressed mode.

In a preferred embodiment an ADF4213 Integer-N Dual RF/IF PLL Frequency Synthesizer 1.0 GHz/3 GHz or a different but compatible phase locked loop (PLL) frequency synthesiser from Analog Devices (AD) or from a further supplier are used as phase lock loop frequency synthesisers 211, 221, and 231. Devices with one or up to four PLL synthesiser in one package can be used. PLL synthesisers from Analog Devices are preferred due to their very short settling times achieved with the built-in so-called Fastlock Mode, but devices from other manufacturers may be used as well.

In a further preferred embodiment of the present invention, all digital circuit elements are implemented in one ASIC (Application Specific Integrated Circuit), while only for the voltage controlled oscillators 215, 225, and 235, the mixer 227, the filters 238 and 242, and the reference frequency source 201 discreet or integrated circuit devices are used.

Figure 3:
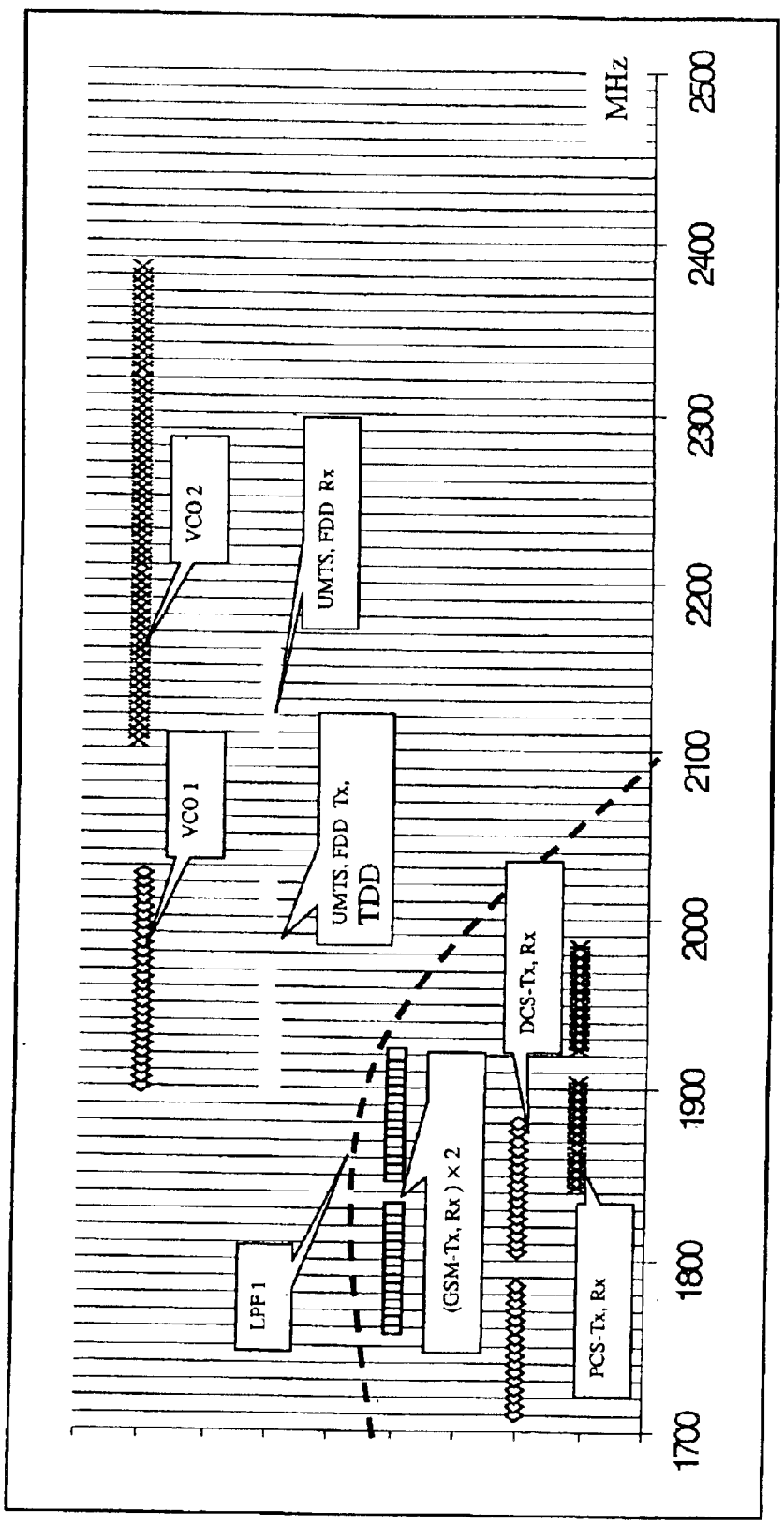
FIG. 3 is a frequency plan of the multi-band frequency synthesiser shown in FIG. 2.

A frequency plan of a multi-band frequency synthesiser 200 according to the present invention is given in FIG. 3. Except for UMTS frequency bands which show a high interference immunity, none of the frequencies produced in one of the VCO's which also includes the harmonics, must not fall into a reception or a transmission band of the multi-band frequency synthesiser 200 to fulfil the requirements of GSM standard 0505. This is achieved by using frequencies for the VCO's which lay fairly above the GSM/GPRS frequencies. Further, also the harmonics of VCO3 235 when down-scaled by digital frequency divider 237 must not fall into a GSM/GPRS reception or transmission band.

Further, none of the frequencies of a VCO's equals that of another VCO to prevent a direct lock which would result in a serious decrease of the spectrum performance. VCO's with a small tuning range show a better spectrum performance than those with a wide tuning range, and are therefore preferably used in a multi-band frequency synthesiser according to the present invention. This is particularly true for VCO3 235. VCO's with a maximum frequency equal or not far above the used maximum frequency are preferred, for the power consumption of a VCO increases with its maximum frequency specification which in turn will reduce the recharging intervals of a mobile terminal.

For keeping low pass filters 238 and 242 small, image frequencies requiring complex filtering have to be avoided. The maximum values of $f_{o3}/M_1$ must therefore not exceed 0.1 $f_{o2}$ to achieve an effective saturation of spurious components at the frequency mixer 227 output.

The frequency plan of FIG. 3 further shows the filter characteristic of loop filter 214 (LPF1) indicating that its bandwidth is sufficiently broad to allow a fast switching of frequencies at VCO 215, but is also sufficiently narrow to prevent phase noise in the output spectra of the phase locked loop frequency synthesiser 211.

Figure 4:
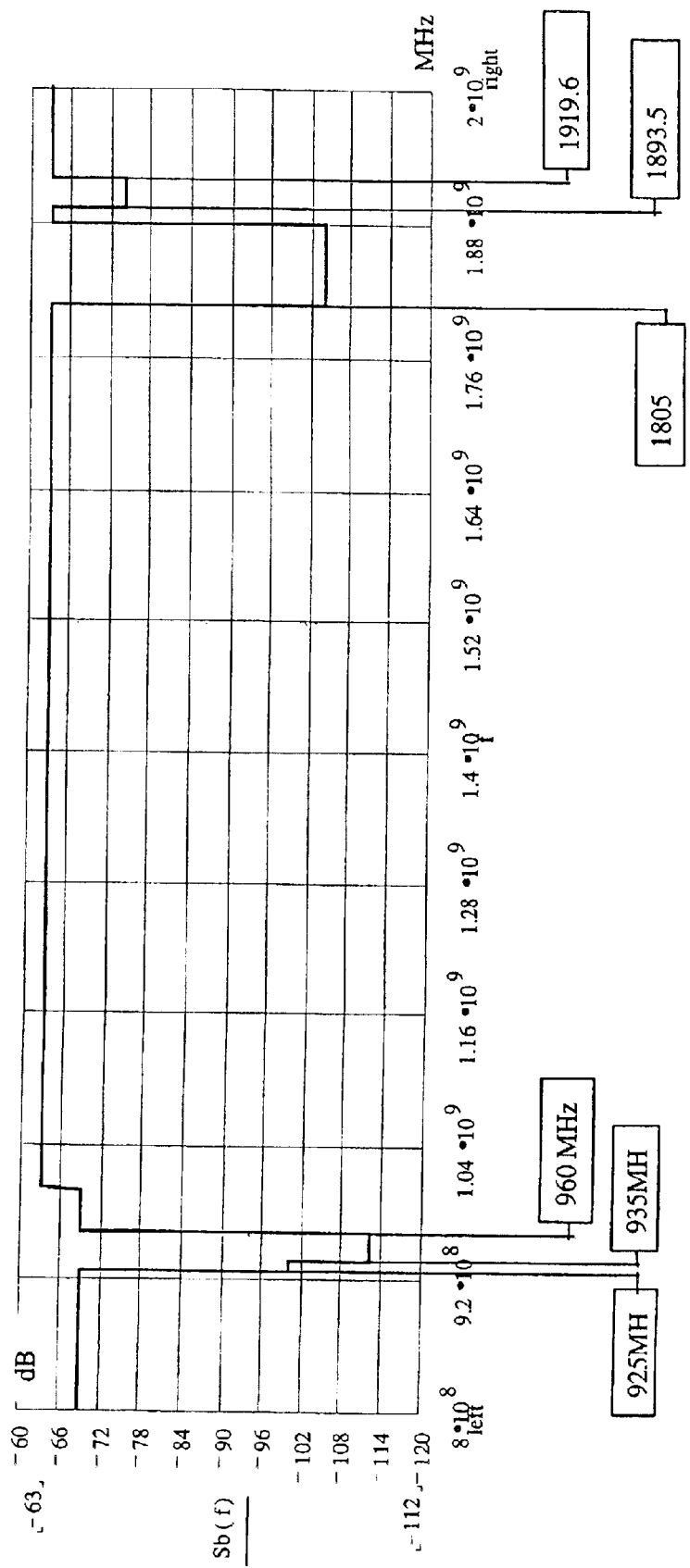
FIG. 4 shows the reference sensitivity level versus frequency defining the limitations for outband emissions for all frequency bands to be considered.

The frequencies of the VCO's are chosen in such a manner, that neither the frequencies themselves nor a harmonic produced in the process falls within a band with maximum requirements for spurious suppression. For the third synthesiser branch 204 of the multi-band frequency synthesiser 200 according to the present invention the said has to be applied to the frequencies and harmonics of signals produced by VCO3 235 divided by $M_1$. In this manner, the requirements for outband emissions according to GSM standard 0505 as shown in FIG. 4 are fulfilled with minimal design effort by low circuit complexity.

What is claim is:

1. A frequency synthesizer arrangement for generating signals with frequencies for UMTS and GSMIGRPS frequency bands, comprising
    a reference frequency source (201) for providing a signal of constant reference frequency,
    a first frequency synthesizer sub-unit (202) for transforming the signal of the reference frequency source (201) into a signal with a frequency in a range of a first type of frequency band,
    a second frequency synthesizer sub-unit (203) for transforming the signal of the reference frequency source (201) into a signal with a frequency a range of a second type of frequency band, said second frequency synthesizer sub-unit (203) further transforming the signal of the reference frequency source (201) into a signal with an intermediate frequency, and
    a third frequency synthesizer sub-unit (204) for transforming the signal of the reference frequency source (201) into an auxiliary signal with a fixed frequency which is used together with the signal of intermediate frequency for generating signals with frequencies in a range of a third and of a fourth type of frequency band,
    whereby a frequency mixer (227) mixes said signal from the second synthesizer sub-unit (203) with a signal derived from the auxiliary signal for forming a signal in a range of the third type of frequency band, and
    a frequency divider (241) derives a signal in a range of the fourth type of frequency band from said signal supplied by the frequency mixer (227) by dividing the frequency of said signal supplied by the frequency mixer (227) with an integer value.

2. A frequency synthesizer arrangement according to claim 1, characterized in, that a frequency synthesizer sub-unit (202, 203, 204) comprises a frequency divider (212, 222, 232) for transforming the signal of the reference frequency source (201) into a scaled-down signal which frequency value represents the reference frequency divided by an integer value.

3. A frequency synthesiser arrangement according to claim 2, characterized in, that a frequency synthesiser sub-unit (202, 203, 204) comprises a phase locked loop frequency synthesiser (211, 221, 231) for transforming said scaled-down signal into a signal which frequency is an integer multiple of the scaled-down signal.

4. A frequency synthesiser arrangement according to claim 1, characterized in, that a frequency divider (237) divides the frequency of the auxiliary signal by an integer value before it is being applied to the frequency mixer (227).

5. A frequency synthesiser arrangement according to claim 1, characterized in, that a low pass filter (238) is used to eliminate harmonics created in the circuitry for generating signals used for a signal with a frequency in a range of the third or the fourth type of frequency band.

6. A frequency synthesiser arrangement according to claim 5, characterized in, that a low pass filter (242) is used to eliminate harmonics created by the frequency divider (241) providing the signals for the fourth type of frequency band.

7. A frequency synthesiser arrangement according to claim 1, characterized in, that the frequencies of said first type of frequency band take on values from one of the frequency intervals ranging from 1900 MHz to 1980 MHz and 2010 MHz to 2025 MHz, the frequencies of said second type of frequency band take on values from the frequency interval ranging from 2110 MHz to 2170 MHz, the frequencies of said third type of frequency bands take on values from one of the frequency bands situated within an interval ranging from 1710 MHz to 1990 MHz, and the frequencies of said fourth type of frequency bands take on values from one of the frequency bands situated within an interval ranging from 880 MHz to 960 MHz.

8. A mobile terminal for use with UMTS and GSMIGPRS frequency bands comprising a frequency synthesiser arrangement according to claim 1.

* * * * *